United States Patent [19]
Komorita et al.

[11] Patent Number: 5,672,848
[45] Date of Patent: Sep. 30, 1997

[54] CERAMIC CIRCUIT BOARD

[75] Inventors: Hiroshi Komorita, Yokohama; Tadashi Tanaka, Matsudo; Takayuki Naba, Kawasaki; Takashi Hino, Yokohama, all of Japan

[73] Assignee: Kabushiki Kaisha Toshiba, Kawasaki, Japan

[21] Appl. No.: 365,483

[22] Filed: Dec. 28, 1994

[30]   Foreign Application Priority Data

Dec. 28, 1993   [JP]   Japan ................................. 5-336723

[51] Int. Cl.$^6$ ........................................................ H01L 23/00
[52] U.S. Cl. ........................... 174/260; 361/768; 257/739
[58] Field of Search ........................... 174/260, 261, 174/262, 250, 263; 361/760, 767, 768, 770, 771; 257/734, 739; 439/68

[56]   References Cited

U.S. PATENT DOCUMENTS 5,281,770   1/1994   Kamei et al. ............................ 174/261
5,420,377   5/1995   Bresin et al. ............................ 174/263

FOREIGN PATENT DOCUMENTS 3-51119   8/1991   Japan .
5-97533   4/1993   Japan .

Primary Examiner—Kristine L. Kincaid
Assistant Examiner—Paramita Ghosh
Attorney, Agent, or Firm—Foley & Lardner

[57]   ABSTRACT

A ceramic circuit board wherein a copper circuit plate is directly bonded at a predetermined position on a ceramic substrate and heat is applied; or the copper circuit plate is integrally bonded through a brazing material containing an active metal, such as Ti, Zr and Hf; and a semiconductor element is bonded onto a semiconductor element mounting portion of the copper circuit plate through a solder layer. The copper plate element is formed with grooves or holes thereon and is bonded on the semiconductor element mounting portion of the copper circuit plate, and the semiconductor element is integrally bonded onto a surface of a grooved or holed side of the copper plate element through a solder layer. By the above structure, the ceramic circuit board prevents solder voids when soldering the semiconductor element onto the copper circuit plate, thereby reducing the dispersion of the thermal resistance values between the semiconductor element and the ceramic substrate, and reducing or mitigating the thermal stress applied or acting on the mounting portion of the semiconductor element.

21 Claims, 3 Drawing Sheets

CERAMIC CIRCUIT BOARD

BACKGROUND OF THE INVENTION

1. Field of the Invention

The present invention relates to a ceramic circuit board wherein metal circuit plates and a semiconductor element are bonded onto a ceramic substrate, and more particularly, to a ceramic circuit board enabling to reduce dispersion of thermal resistance value between the semiconductor element and the ceramic substrate, and having a small dispersion of transient thermal characteristics.

2. Description of the Related Art

Recently, as circuit boards used for power transistor modules and for switching power modules having high-power and large capacity, various ceramic circuit boards have been developed and practically utilized. The ceramic circuit board comprises a ceramic substrate and metal plates (conductive layers) such as copper plates having large electric current capacity, the metal plates being bonded onto the ceramic substrate.

For example, as shown in FIG. 5 and FIG. 6, such conventional ceramic circuit board 1 is manufactured by using, a so-called, direct bonding copper (DBC) method comprising the steps of: locating copper circuit plates $3a$, $3b$ and $3c$ blanked in predetermined forms at predetermined positions on a surface of a ceramic substrate 2 such as aluminum oxide (alumina: $Al_2O_3$), the copper circuit plates being composed of Cu or a Cu alloy; heating them at a temperature higher than the eutectic temperature of copper and oxygen in a state depressed toward the substrate; generating a Cu—O eutectic liquid phase at the bonding boundary thereof; wetting the ceramic substrate 2 with this liquid phase; performing cooled-solidification of the liquid phase; and directly bonding the copper circuit plates $3a$, $3b$, and $3c$ onto the ceramic substrate 2.

Further, a semiconductor element 5 is bonded through a solder layer 4 to a mounting portion of the semiconductor element of the bonded copper circuit plate $3a$. In addition, so as to prevent deformation such as warpage due to difference of thermal expansion between the ceramic substrate 2 and copper circuit plates $3a$, $3b$ and $3c$, there may be a case where a backing (backside) copper plate 6 is bonded onto the back surface of the ceramic substrate 2 with the same bonding method if necessary.

On the other hand, as a bonding method for the ceramic substrate 2 and copper circuit plates $3a$, $3b$ and $3c$, there is an active metal brazing method besides the direct bonding copper method. When the ceramic circuit board is manufactured by using this active metal brazing method, the procedure comprises the steps of: preparing or manufacturing copper and silver brazing paste including Ti and the like; contacting and locating each other through applying the brazing paste between copper circuit plates blanked in predetermined forms and the ceramic substrate to form an assembly; and heating the assembly thereby to generate compounds for increasing wettability of a brazing material against the ceramic substrate. Thus, when an oxide ceramic substrate is used, TiO is generated, and when a nitride ceramic substrate is used, TiN is generated, for increasing the wettability of the brazing material against each ceramic substrate. Subsequently, each of the copper circuit plates is integrally bonded onto the ceramic substrate by means of eutectic compounds consisting of the the copper and silver brazing material.

Here, an oxide series ceramic sintered-body such as alumina ($Al_2O_3$) or ferrite (FeO), or a non-oxide series ceramic sintered-body such as aluminum nitride (AlN) and silicon nitride ($Si_3N_4$) is used as the ceramic substrate.

As described above, the ceramic circuit board, which is manufactured by bonding the copper circuit plates onto the ceramic substrate in accordance with the direct bonding copper method or the active metal brazing method, has high bonding strength between the ceramic substrate and the copper circuit plates, and has a simple structure. Hence, the ceramic circuit board has the advantages of enabling performance of high-density assembling in a small size, and also to simplify or shorten the manufacturing processes thereof.

However, in the aforementioned conventional ceramic circuit board, since the surface of the copper circuit plate is formed so as to be flat and smooth, so-called "solder voids" 7 are easily formed as shown in FIG. 6. Namely, when the semiconductor element is bonded through the solder layer onto the mounting portion of the surface of the copper circuit plate, an atmospheric air is partially involved or mixed into the solder layer, thus resulting in the formation of the solder voids.

Due to the formation of these solder voids, a non-bonded portion having high thermal resistance between the semiconductor element and copper circuit plate is formed, so that there may be posed problems such that a large amount of heat generated at the semiconductor element is not smoothly transferred toward the ceramic substrate, and that defect on thermal resistance easily occurs in an evaluation of a module using this circuit board, and a manufacturing yield of a final product is disadvantageously lowered. In particular, since there is large dispersion of sizes and frequent occurrence of solder voids, dispersion of the thermal resistance of the circuit board is increased at a transient thermal resistance test. Therefore, it becomes difficult to control the manufacturing conditions.

In addition, an excessively large thermal stress caused by the heat generated at the semiconductor element is repeatedly applied to the ceramic substrate, and there may also be posed the problem of a crack that easily occurs in the ceramic substrate, and endurance or durability of the circuit board is disadvantageously lowered.

SUMMARY OF THE INVENTION

The present invention is to solve the aforementioned problems, and hence, an object of the present invention is to provide a ceramic circuit board capable of preventing solder voids when soldering the semiconductor element on the copper circuit plate, reducing the dispersion of the thermal resistance values between the semiconductor element and the ceramic substrate, and reducing or mitigating the thermal stress to be applied on the mounting portion of the semiconductor element.

In order to achieve the aforementioned object, the first ceramic circuit board according to the present invention is constructed so as to comprise: a ceramic substrate; a copper circuit plate directly bonded by heating at a predetermined position on the ceramic substrate; a copper plate element directly bonded to a semiconductor element mounting portion of the copper circuit plate, the copper plate element having grooves or holes formed thereon; and the semiconductor element bonded onto the copper plate element, wherein the semiconductor element is integrally bonded through a solder layer on a surface side of the copper plate element to which the grooves or holes are formed.

Further, the second ceramic circuit board according to the present invention is constructed so as to comprise: a ceramic substrate; a copper circuit plate integrally bonded at a predetermined position on the ceramic substrate through a brazing material including active metal such as Ti, Zr and Hf; a copper plate element bonded on a semiconductor element mounting portion of the copper circuit plate through the brazing material, the copper plate element having grooves or holes thereon; and a semiconductor element bonded onto the surface of the copper plate element, wherein the semiconductor element is integrally bonded through a solder layer onto a surface side of the copper plate element to which the grooves or holes are formed.

Here, aforementioned ceramic substrate may be formed from at least one ceramic sintered-body selected from the group consisting of aluminum oxide ($Al_2O_3$), aluminum nitride (AlN), beryllium oxide (BeO), silicon carbide (SiC) and silicon nitride ($Si_3N_4$).

As a ceramic substrate used for a ceramic circuit board according to the present invention, an aluminum oxide ($Al_2O_3$) sintered body having an excellent electric insulation property can be used. In particular, so as to form a circuit board having an excellent radiating property, it is preferable to use aluminum nitride (AlN), beryllium oxide (BeO), or silicon carbide (SiC). However, silicon carbide (SiC) has a relatively low insulation resistance, while the beryllium oxide (BeO) has a disadvantage of toxicity. Therefore, in order to obtain a ceramic circuit board having an excellent electric insulation property and radiation property, it is preferable to use the aluminum nitride (AlN) sintered body as the ceramic substrate.

In this regard, if the thickness of the ceramic substrate is set to a range of 0.3–1 mm, the thickness of each copper circuit plate is set to a range of 0.1–0.6 mm, more preferably to a range of 0.2–0.4 mm, and both materials are combined or bonded to form a ceramic circuit board, the influence due to difference of thermal expansion of the two materials can be effectively lowered, whereby a ceramic circuit board having an excellent thermal durability can be obtained.

The aforementioned copper plate element has as a function to prevent occurrence of the solder void when soldering the semiconductor element onto the copper plate element, and also has as a function to mitigate or reduce the thermal stress caused by the heat generated in accordance with operation of the semiconductor element. In particular, the thermal stress is liable to be concentrated at the semiconductor element mounting portion. However, when the copper plate element is bonded on to the surface of the semiconductor element mounting portion, thermal stress applied to ceramic substrate can be effectively mitigated, so that a ceramic circuit board free from crack formation can be obtained.

The thickness of the copper plate element is set to a range of 0.05–0.4 mm. A plurality of grooves or holes each having a predetermined size are formed on the copper plate element. Further, the width of the grooves or the diameter of the holes is set to a range of 0.05–1.0 mm, more preferably to a range of 0.2–0.4 mm. An alignment pitch of the grooves or holes is set to a range of 1–10 mm, more preferably to a range of 1.5–2 mm, and the depth is preferably set to a range of 50–150 μm. These grooves or holes can be formed as through-grooves or through-holes passing through the copper plate element toward its thickness direction, or as shown in FIG. 3, they can be formed as blind holes 8 whose depth are 50–150 μm. The diameter of the blind hole is more preferably set to a range of 10–200 mm.

The copper plate element and grooves or holes can be formed by pressing a copper plate material having a predetermined thickness by means of a mechanical pressing machine, or by blanking-off the plate material by means of the mechanical pressing machine, or by performing an etching process to the copper plate material.

Further, in a case where each copper circuit plate and backing copper plate are integrally bonded directly onto the ceramic substrate in accordance with the direct bonding copper method (DBC method), each of the copper circuit plates, the copper plate element and the backing copper plate are contacted and located on the surface of the ceramic substrate thereby to form an assembly. Then, the assembly is heated up to a temperature range of 1065° C. (copper-copper oxide eutectic temperature) to 1083° C. (melting point of copper) under an environment of, for example, inert gas such as nitrogen. In this case, as a material for constituting the copper circuit plate, it is preferable to use a copper material including 100–2000 ppm of oxygen so as to generate enough amount of eutectic compound. In this regard, for example, tough pitch electrolytic-copper containing an adequate amount of oxygen is preferable.

Furthermore, the copper plate element having grooves or holes formed thereon is also located on the copper circuit plate having the semiconductor element mounting portion, and is bonded on the copper circuit plate by utilizing the aforementioned DBC method.

In a case where non-oxide series ceramic sintered-body is used as the ceramic substrate, the DBC method is difficult to be used as the bonding method for bonding the metal plates onto the ceramic substrate. Therefore, in a case where an AlN substrate or the like is used as the ceramic substrate, it is necessary to form an oxide film or the like on the surface of the ceramic substrate beforehand.

On the other hand, in a case where each of the copper circuit plates, the copper plate element and the backing copper plate are bonded by using an active metal brazing method, at first, a brazing layer containing active metals is formed at a predetermined position on a surface of the ceramic substrate. This active metal containing brazing layer contains active metal such as Ti, Zr, Hf and Nb, and is composed of an Ag—Cu—Ti series brazing material or the like having a suitable composition ratio. The brazing layer can be formed in accordance with, for example, the screen printing method wherein a composite paste for bonding is screen printed onto the surface of the ceramic substrate. The composite paste for bonding is prepared or manufactured by dispersing the aforementioned brazing composite into organic solvent.

As concrete examples of the composite paste for bonding, the following pastes are recommended. Namely, one example is a composite paste manufactured in accordance with a method comprising the steps of: preparing a brazing composite composed of 15–35% (weight %) of Cu, 1–10% of at least one active metal selected from Ti, Zr, Hf and Nb, and balance of Ag which substantially occupies the residual percent; and dispersing the brazing composite into organic solvent.

Another example is a composite paste manufactured in accordance with a method comprising the steps of: preparing a brazing composite composed of 15–35% (weight %) of Cu, 1–10% of at least one active metal selected from Ti, Zr, Hf and Nb, 5–40% of at least one selected from W, Mo, AlN, $Si_3N_4$ and BN, and a balance of Ag which substantially occupies the residual percent; and dispersing the brazing composite into an organic solvent.

The aforementioned active metals are components for improving wettability of a brazing material with respect to the ceramic substrate, and especially these active metals are effective in a case where an aluminum nitride (AlN) substrate is used as a ceramic substrate. In regard to the mixing percentage (mixing ratio) of the active metal with respect to an entire brazing composite, a range of 1–10 weight percent is suitable.

W, Mo, AlN, $Si_3N_4$ and BN are effective components enabling reduction or mitigation of the stress caused at a bonded portion between the ceramic substrate and copper circuit plates, and the components may be added into the brazing composite at an amount of 5–40 weight %. Namely, in a case of bonding the copper circuit plates onto the ceramic substrate, in order to reduce or mitigate the residual thermal stress caused by difference of thermal expansion coefficients of the copper circuit plate and the ceramic substrate, it is effective to prepare the brazing composite so that the composite shall possess a function of forming a reactive layer for bonding the ceramic substrate and metal plates such as the copper circuit plates. In addition to this function, it is also effective to prepare the brazing composite so that the reactive layer per se possesses a function of mitigating the thermal stress.

In addition, when the components such as W, Mo, AlN, $Si_3N_4$ and BN whose thermal expansion coefficients are comparatively close to that of the ceramic substrate are added into a brazing material mainly composed of Ag—Cu composite having electric conductivity, the reactive layer formed by the brazing material exhibits the function of mitigating the thermal stress whereby there can be provided a ceramic circuit board having a high bonding strength and excellent temperature cycle test (TCT) characteristics including thermal-shock resistance and heat resistance.

In particular, in a case where the ceramic substrate is an aluminum nitride sintered-body, when a brazing material prepared by adding W, Mo and AlN into the Ag—Cu brazing material is used, an excellent bonded body can be obtained having substantially no cracks and peelings.

Further, the Ag—Cu component is effective as a component to promote formation of a bonding layer for firmly bonding the ceramic substrate and Ti, and contributes to dispersing Ti whereby there can be formed a strong bonded-body.

The ceramic circuit board using the active metal brazing method is manufactured in accordance with, for example, the following processes. Namely, the brazing composite paste (brazing material paste containing active metal) is applied or coated using the screen printing method or the like onto surfaces of the ceramic substrate, the surfaces corresponding to bonding portions for copper circuit plates. Subsequently, the coated paste is dried thereby to form patterns of brazing material layer containing active metals. Next, copper circuit plates and the like are contacted and located onto the patterns of the brazing material layer containing the active metal thereby to form an assembly. Then, the assembly is heated up to a temperature range of 780°–1083° C. in a vacuum or inert gas environment. The temperature of 780° C. corresponds to an eutectic temperature of the Ag—Cu compound, and the temperature of 1083° C. corresponds to a melting point of copper (Cu). As the result of the heating treatment, the copper circuit plates and the like are integrally bonded onto the surfaces of the ceramic substrate through the brazing layer containing the active metal. At the same time, by using this active metal brazing method, the copper plate element having grooves or holes thereon is also integrally bonded on the surface of the copper circuit plate having the semiconductor element mounting portion.

In this manner, using the direct bonding copper (DBC) method or the active metal brazing method, each of the copper circuit plates and backing copper plate (backside copper plate) are integrally bonded onto predetermined positions of the ceramic substrate, the copper plate element having grooves or holes thereon is integrally bonded onto the copper circuit plate having the semiconductor element mounting portion, and finally, the semiconductor element is bonded by performing solder bonding onto the surface of the copper plate element whereby the ceramic circuit board according to the present invention is manufactured.

According to the ceramic circuit board having the aforementioned structure, the copper plate element having grooves or holes thereon is bonded on the copper circuit plate, and the semiconductor element is bonded on this copper plate element through a solder layer. Hence, even if the bonding operation is carried out in such a manner that any atmospheric air or external air is disadvantageously involved into the solder layer at the time of mounting the semiconductor element, the involved air is introduced and accommodated in the grooves or holes of the copper plate element. Therefore, the width of solder voids formed at the boding surface can be reduced and limited to the width (or less) of the groove or holes. In addition, since surplus or excess solder is also accommodated in the grooves or holes, tight-coupling properties or adhesion characteristics between the semiconductor element and copper plate element can be increased. Therefore, dispersion of thermal resistance values between the semiconductor element and ceramic substrate is reduced, whereby the ceramic circuit board having a small dispersion of thermal transient characteristics.

Further, because the copper plate element is inserted between the semiconductor element and the semiconductor element mounting portion of the copper circuit plate, thermal stress caused by heat generation of the semiconductor element can be reduced. Consequently, cracks and the like, liable to be formed on the ceramic substrate can be effectively prevented, and there can be obtained a ceramic circuit board having excellent endurance or durability.

DESCRIPTION OF THE PREFERRED EMBODIMENTS

Next, an embodiment of the present invention will be described with referring to the accompanying drawings.

Embodiment 1 and Comparative Example 1

Figure 1:
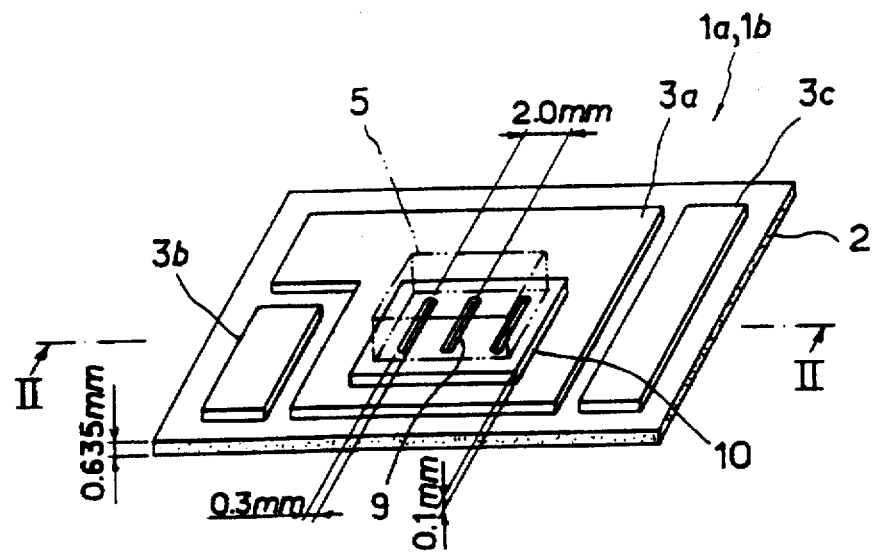
FIG. 1 is a perspective view showing an embodiment of a ceramic circuit board according to the present invention.
Figure 2:
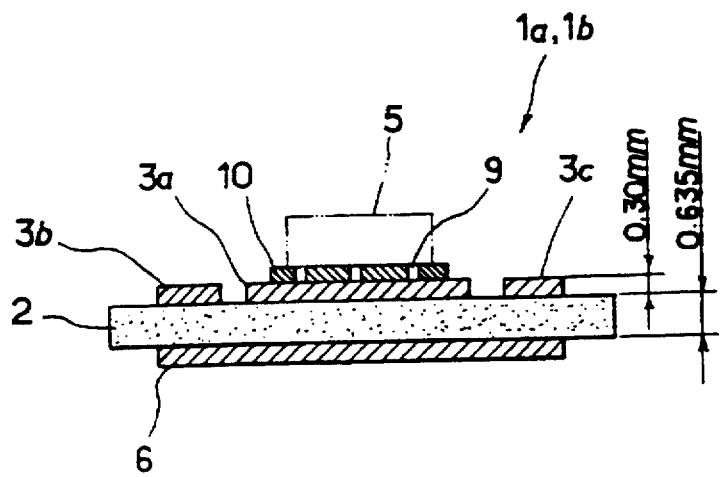
FIG. 2 is a cross-sectional view taken on the line II—II of FIG. 1.

FIG. 1 is a perspective view showing an embodiment of a ceramic circuit board according to the present invention, and FIG. 2 is a cross-sectional view taken on the line II—II of FIG. 1.

Namely, in the ceramic circuit board 1a according to Embodiment 1, a plurality of copper circuit plates 3a, 3b, 3c and a backing copper plate 6 are located at predetermined positions on a ceramic substrate 2, and a copper plate element 10 having grooves 9 thereon is located on a semiconductor element mounting portion of the copper circuit plate 3a thereby to form an assembly. Then, the assembly is heated whereby the copper circuit plates 3a, 3b, 3c and the backing copper plate 6 are directly bonded on the surface of the ceramic substrate 2, and the copper plate element 10 having grooves 9 thereon is directly bonded onto to the semiconductor element mounting portion of the copper circuit plates 3a. Then, a semiconductor element 5 is integrally bonded onto a surface side, to which the grooves 9 are formed, of the copper plate element 10 through a solder layer, whereby the ceramic circuit board 1a of Embodiment 1 is constructed.

The aforementioned ceramic circuit board 1a was manufactured in accordance with following procedure. Namely, at first, a tough pitch electrolytic-copper plate having a thickness of 0.1 mm was subjected to an etching treatment thereby to form a copper plate material having through-grooves 9 in a size of width 0.3 mm×length 3.0 mm×pitch 2.0 mm. Then, the copper plate material having the through-grooves 9 was blanked by press working thereby to prepare or manufacture a copper plate element 10 having through-grooves 9. On the other hand, tough pitch electrolytic-copper plates having various thicknesses of 0.2 to 0.5 mm were blanked thereby to prepare the copper circuit plates 3a, 3b, 3c and the backing copper plate 6 each having a predetermined circuit pattern and thickness.

Also a plate-type of aluminum nitride (AlN) substrate having a thickness of 0.635 mm was prepared. Then, each AlN substrate was heated up to a temperature of 1200° C. for one hour in an atmospheric air, thereby to form an oxide film on a surface of the AlN substrate. Subsequently, each of the copper circuit plates 3a, 3b, 3c and the backing copper plate 6 were respectively contacted and located on a front surface and back surface of the AlN substrate having the oxide film (Al$_2$O$_3$) formed thereon, and the copper plate element 10 having the grooves 9 formed thereon was contacted and located at a portion corresponding to the semiconductor element mounting portion of the copper circuit plate 3a, thereby to form an assembly. Then, the assembly was heated up to a temperature of 1075° C. for 10 minutes in a nitrogen gas environment thereby to integrally bond the copper plates 3a, 3b, 3c, 6 onto the ceramic substrate 2, and to integrally bond the copper plate element 10 onto the copper circuit plate 3a. In addition, the semiconductor element 5 was solder-bonded onto the surface of the copper plate elements 10 whereby various ceramic circuit boards according to Embodiment 1 were prepared or manufactured.

On the other hand, ceramic circuit boards of Comparative Example 1 were prepared in generally the same manner as in Embodiment 1, except that a copper plate element 10 having grooves 9 formed thereon was not used and the semiconductor element 5 was directly bonded onto the semiconductor element mounting portion of the copper circuit plate 3a through the solder layer.

Then, the thus formed ceramic circuit boards according to Embodiment 1 and Comparative Example 1 were assembled into modules, and consequently, a transient thermal resistance measuring test was performed with respect to each assembled module. As the result of the tests, it was confirmed that the thermal resistance of the ceramic circuit board according to Embodiment 1 was remarkably reduced in comparison with that of the ceramic circuit board according to Comparative Example 1. That is because, in Embodiment 1, using the copper plate element 10 having the grooves 9 thereon, since voids or bubbles that mixed or invaded into the solder layer the solder bonding process of the semiconductor element 5 were introduced or accommodated in the grooves 9, excessively large solder voids larger than the groove width were not formed. The solder wetting rate (wetted surface ratio) of Comparative Example 1 was 95%, while that of the Embodiment 1 was improved to be more than or equal to 98%. Therefore, dispersion of the thermal resistance was reduced, defects of the transient thermal resistance could be reduced, and reliability of modules using these ceramic circuit boards could be sharply increased.

Further, for the purpose of evaluating endurance or durability and reliability of the ceramic circuit boards 1a according to Embodiment 1 and Comparative Example 1, the following temperature cycle test (TCT) i.e., thermal shock test, was performed, and the state of crack occurrence in these ceramic circuit boards was investigated.

The temperature cycle test repeats a cycle of temperature-rise and temperature-fall, and one cycle of TCT comprises the steps of: cooling the ceramic circuit board to a temperature of −40° C. and holding this state for 30 minutes; returning the temperature of the board to room temperature (25° C.) and holding this state for 10 minutes; heating the board up to a temperature of +125° C. and holding this state for 30 minutes; and cooling the board to the room temperature (25° C.).

Using 100 pieces of the ceramic circuit boards according to each embodiment, the temperature cycle test was performed, and the TCT cycle count until an initial crack occurred on the AlN substrates was measured. The test results are shown in FIG. 4.

Figure 4:
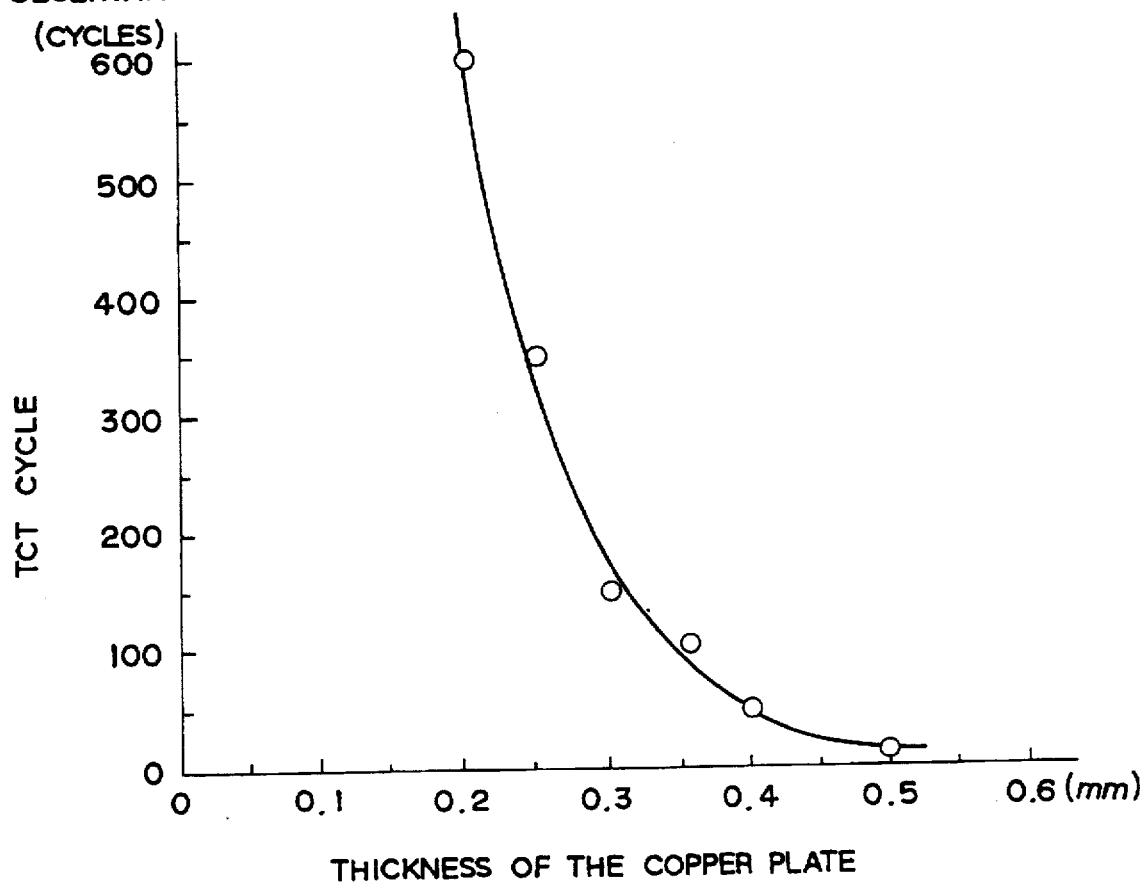
FIG. 4 is a graph showing relationship between thickness of a copper circuit plate and TCT cycle number.
Figure 5:
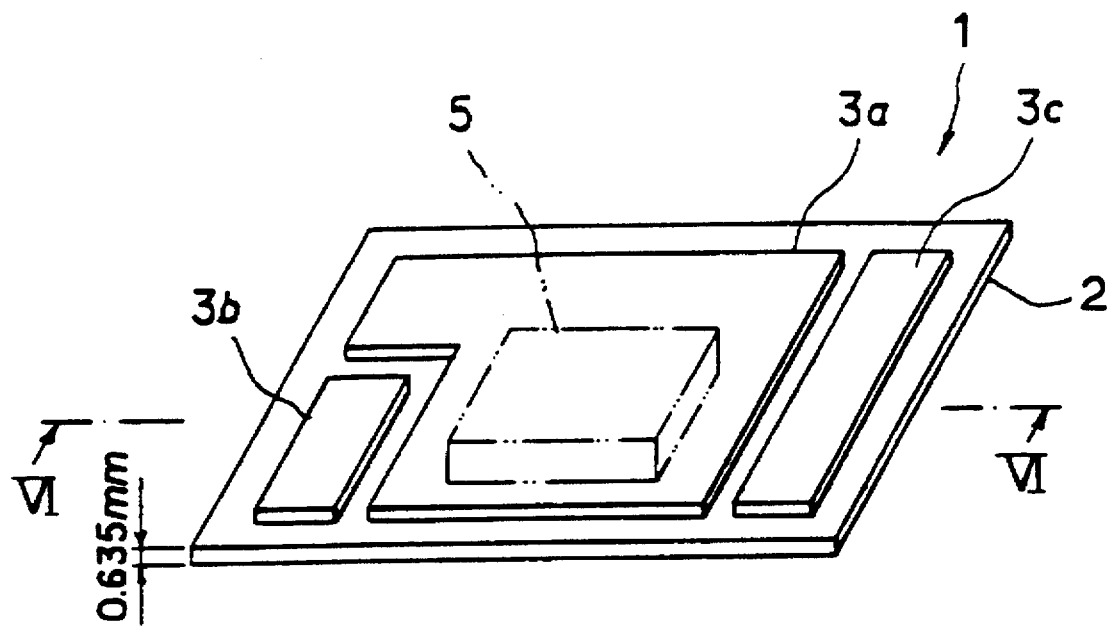
FIG. 5 is a perspective view showing a structural example of a conventional ceramic circuit board.
Figure 6:
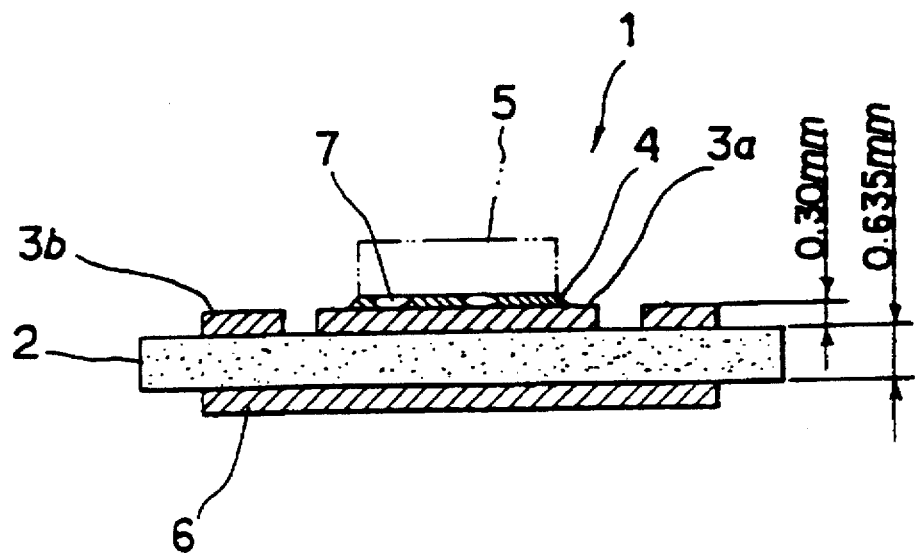
FIG. 6 is a cross-sectional view taken on the line VI—VI of FIG. 5.

As is apparent from the test result shown in FIG. 4, the ceramic circuit boards of Embodiment 1 having copper circuit plates, whose thicknesses were set to the range of 0.2–0.35 mm a crack in the AlN substrate and peeling of the copper circuit plate did not occur even after 100 cycles of TCT. Hence, these ceramic circuit boards were confirmed to have excellent endurance and reliability. On the other hand, in the ceramic circuit boards of Comparative Example 1, 5% of AlN substrates were confirmed to have cracks occur therein after 100 cycles of TCT.

Thus, according to the ceramic circuit boards of of Embodiment 1, the copper plate element is bonded onto the semiconductor element mounting portion of the copper circuit plate, so that electric capacity of the mounting portion can be kept high. This means that the thickness of the copper circuit plate except for the mounting portion can be made thin. Owing to these thin copper circuit plates, thermal stress would not concentrate at to the bonding portion of the copper circuit plate and ceramic substrate, whereby the temperature cycle characteristics can be remarkably improved.

Embodiment 2 and Comparative Example 2

A ceramic circuit board 1b according to Embodiment 2 was manufactured by using the same material and method as those in Embodiment 1 except that the oxide film was not formed on the surface of the AlN substrate 2 and the active metal brazing method was used for bonding the copper circuit plates 3a, 3b, and 3c onto the AlN substrate 2 and for bonding the copper plate element 10 having grooves 9 onto the copper circuit plate 3a.

Namely, the manufacturing procedure was performed in such a manner that a brazing material composed of 30 wt % of Ag, 65% of Cu, and 5% of Ti was screen printed onto predetermined positions of both surface sides of the aluminum nitride substrate 2 having a thickness of 0.635 mm, the predetermined positions corresponding to the surface portions where the copper circuit plate and backing copper plate would be bonded. Then, the screen printed brazing materials are dried thereby to form patterns of brazing material layers containing the active metal.

Subsequently, a plate-type of the copper circuit plates each having predetermined shapes were contacted and located at the predetermined positions on the patterns of the brazing material layers containing the active metal, and further, the copper plate element 10 was also contacted and located at a portion corresponding to the semiconductor element mounting portion of the copper circuit plate 3a similarly through the brazing material layer containing the active metal, thereby forming an assembly. Then, the assembly was heated in a vacuum atmosphere at the temperature of 850° C. for 10 minutes so as to bond the materials constituting the assembly to each other, thereby obtaining a bonded body. Finally, a semiconductor element 5 was solder-bonded onto the surface of the copper plate element 10 whereby the ceramic circuit board 1b according to Embodiment 2 was prepared or manufactured.

On the other hand, ceramic circuit boards according to Comparative Example 2 were prepared or manufactured by using the same materials and method as in Embodiment 2 except that the copper plate element 10 having the grooves was not used and the semiconductor element 5 was directly bonded onto the mounting portion of the semiconductor element of the copper circuit plate 3a through the solder layer.

Then, the thus manufactured ceramic circuit boards according to Embodiment 2 and Comparative Example 2 were assembled into modules as in the same manner as in Embodiment 1, and a transient thermal resistance measuring test was performed. As the result, it was confirmed that the thermal resistance of the ceramic circuit board according to Embodiment 2 was remarkably reduced in comparison with that of the ceramic circuit board according to Comparative Example 2. In addition, the solder wetting rate (solder-wetted area ratio) at the bonding surface of the semiconductor element 5 in Comparative Example 2 was at most 94%, while that of Embodiment 2 was improved to be more than or equal to 98%.

Further, so as to evaluate endurance and reliability of the ceramic circuit boards 1b according to Embodiment 2 and Comparative Example 2, the temperature cycle test (TCT) was performed under the same conditions as in Embodiment 1 for the purpose of investigating the state of crack formation or breakage occurrence in these ceramic circuit boards.

As the result, it was confirmed that for the ceramic circuit boards according to Embodiment 2 a crack of the AlN substrate and a peeling of the copper circuit plate did not occur at all even after 100 cycles of TCT, and hence, these ceramic circuit boards were confirmed to have excellent endurance and reliability. On the other hand, in the circuit boards of Comparative Example 2, it was confirmed that in 4% of AlN substrates cracks or breakages did occur after 100 cycles of TCT.

Figure 3:
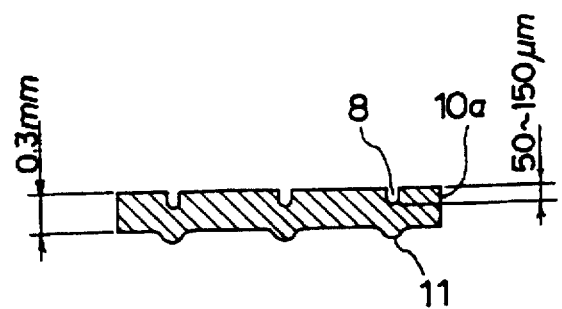
FIG. 3 is a cross-sectional view showing an example of a form of a copper plate element prepared or manufactured by using press forming method.

In the above embodiments, although examples are shown in a case where the copper plate element 10 having the through-grooves 9 thereon is used, however, the present invention is not limited to use such a copper plate element having the through-grooves or through-holes. For example, blind holes 8 as shown in FIG. 3 can be used instead of the through-grooves or through-holes. The blind holes 8 can be formed by press-working the surface portion of the copper plate element material so that the holes would not pass through the material. Even in a case where a copper plate element 10a having such blind holes 8 was used, the same result could be obtained.

By the way, in a case where the blind holes 8 are formed by press-working the copper plate element material, depth adjustment of the blind holes 8 is extremely easy. However, depending on thickness of the copper plate element 10a, deformation such as formation of convex portions 11 on the opposite side of the blind holes 8 becomes disadvantageously large, so that contact efficiency between the copper plate element 10a and the copper circuit plate becomes worse, and hence, there may be a possibility that the thermal resistance at the bonded surface between the two materials will become larger.

As described above, in the ceramic circuit board according to the present invention, the copper plate element having grooves or holes thereon is bonded onto the copper circuit plate, and the semiconductor element is bonded on the surface of this copper plate element through a solder layer. Hence, even if a bonding operation is performed in such a manner that external air is mixed or involved into the solder layer at the time of mounting the semiconductor element, the involved air as a solder void is introduced or accommodated into the grooves or holes of the copper plate element. Therefore, the width of the solder void formed at the boding surface can be reduced to less than or equal to the width of the groove or holes. In addition, since surplus or excessive solder can be also accommodated into the grooves or holes, tight-coupling property of the semiconductor element and copper plate element can be improved. Therefore, dispersion of thermal resistance values between the semiconductor element and ceramic substrate is reduced, whereby a ceramic circuit board having a small dispersion of thermal transient characteristics can be obtained.

Further, since the copper plate element is inserted or interposed between the semiconductor element and the copper circuit plate which has a mounting portion for the element, thermal stress caused by the heat generated from the semiconductor element can be mitigated and reduced. Consequently, cracks and the like which occur on the ceramic substrate can be effectively prevented, so that there a ceramic circuit board having excellent endurance or durability can be obtained.

What is claimed is:

1. A ceramic circuit board comprising:
   a ceramic substrate;
   a copper circuit plate directly bonded with heating onto a predetermined position of said ceramic substrate;
   a copper plate element directly bonded at a semiconductor element mounting portion of said copper circuit plate, said copper plate element being formed with grooves thereon;
   a semiconductor element bonded on said copper plate element,
   wherein the semiconductor element is integrally bonded on a surface of a grooved side of said copper plate element through a solder layer.

2. A ceramic circuit board according to claim 1, wherein the grooves formed with said copper plate element are through-grooves that pass through said copper plate element in a thickness direction of the copper plate element.

3. A ceramic circuit board according to claim 1, wherein said ceramic substrate has a thickness of 0.3–1.0 mm, while said copper circuit plate has a thickness of 0.1–0.6 mm.

4. A ceramic circuit board according to claim 1, wherein said copper plate element has a thickness of 0.05–0.4 mm, while the grooves formed with said copper plate element have a width of 0.05–1.0 mm.

5. A ceramic circuit board according to claim 1, wherein the grooves formed with said copper plate element are formed in an alignment pitch of 1–10 mm.

6. A ceramic circuit board according to claim 1, wherein a backing copper plate is integrally bonded onto a back surface side of said ceramic substrate.

7. A ceramic circuit board comprising:
   a ceramic substrate;
   a copper circuit plate integrally bonded at a predetermined position of said ceramic substrate through a brazing material containing an active metal;
   a copper plate element integrally bonded onto a semiconductor element mounting portion of said copper circuit plate through said brazing material, and said copper plate element being formed with grooves thereon; and
   a semiconductor element integrally bonded onto said copper plate element;
   wherein the semiconductor element is integrally bonded onto a surface of a grooved side of said copper plate element through a solder layer.

8. A ceramic circuit board according to claim 7, wherein the grooves to be formed with said copper plate element are through-grooves that pass through said copper plate element in a thickness direction of said copper plate element.

9. A ceramic circuit board according to claim 7, wherein said ceramic substrate has a thickness of 0.3–1.0 mm, while said copper circuit plate has a thickness of 0.1–0.6 mm.

10. A ceramic circuit board according to claim 7, wherein said copper plate element has a thickness of 0.05–0.4 mm, while the grooves to be formed with the copper plate element have widths of 0.05–1.0 mm.

11. A ceramic circuit board according to claim 7, wherein the grooves to be formed with said copper plate element are formed in an alignment pitch of 1–10 mm.

12. A ceramic circuit board according to claim 7, wherein a backing copper plate is integrally bonded onto a back surface side of said ceramic substrate.

13. A ceramic circuit board according to claim 7, wherein the active metal is selected from a group consisting of Ti, Zr, Hf, and Nb.

14. A ceramic circuit board according to claim 13, wherein the brazing material is a brazing composite of: (i) 15–35% (weight %) of Cu; (ii) 1–10% of the active metal, and wherein the brazing composite is dispersed into an organic solvent.

15. A ceramic circuit board according to claim 3, wherein said ceramic substrate is a material selected from the group consisting of aluminum oxide, aluminum nitride, beryllium oxide, silicon carbide, and silicon nitride.

16. A ceramic circuit board according to claim 1, wherein the grooves formed with said copper plate element are blind-holes whose depth is 50–150 μm in a thickness direction of said copper plate element.

17. A ceramic circuit board according to claim 4, wherein the grooves are blind-holes whose depth is 50–150 μm in a thickness direction of said copper plate element.

18. A ceramic circuit board comprising:
   an aluminum nitride ceramic substrate;
   a copper circuit plate directly bonded with heating onto a predetermined position of said ceramic substrate;
   a copper plate element directly bonded at a semiconductor element mounting portion of said copper circuit plate, said copper plate element being formed with a plurality of through-groove holes thereon, wherein the through-groove holes pass through said copper plate element in a thickness direction of said copper plate element;
   a semiconductor element bonded on said copper plate element,
   wherein said semiconductor element is integrally bonded on a surface of said copper plate element through a solder layer, said semiconductor element thereby covering the plurality of through-groove holes on one side of said copper plate element.

19. A ceramic circuit board comprising:
   an aluminum nitride ceramic substrate;
   a copper circuit plate integrally bonded at a predetermined position of said ceramic substrate through a brazing material containing an active metal selected from the group consisting of Ti, Zr and Hf;
   a copper plate element integrally bonded onto a semiconductor element mounting portion of said copper circuit plate through said brazing material, said copper plate element being formed with a plurality of through-groove holes thereon, wherein the through-groove holes pass through said copper plate element in a thickness direction of said copper plate element;
   a semiconductor element integrally bonded onto said copper plate element;
   wherein said semiconductor element is integrally bonded onto a surface of said copper plate element through a solder layer, said semiconductor element thereby covering the plurality of through-groove holes on one side of said copper plate element.

20. A ceramic circuit board according to claim 18, wherein said aluminum nitride ceramic substrate has a thickness of 0.3–1.0 mm; said copper circuit plate has a thickness of 0.1–0.6 mm; said copper plate element has a thickness of 0.05–0.4 mm; and the through-groove holes, to be formed with said copper plate element, have widths of 0.05–1.0 mm, and are formed in an alignment pitch of 1–10 mm.

21. A ceramic circuit board according to claim 19, wherein said aluminum nitride ceramic substrate has a thickness of 0.3–1.0 mm; said copper circuit plate has a thickness of 0.1–0.6 mm; said copper plate element has a thickness of 0.05–0.4 mm; and the through-groove holes, to be formed with said copper plate element, have widths of 0.05–1.0 mm, and are formed in an alignment pitch of 1–10 mm.

* * * * *